United States Patent
Pruszenski

(10) Patent No.: US 8,073,344 B2
(45) Date of Patent: Dec. 6, 2011

(54) HETERODYNE RECEIVER USING DIFFERENTIAL TEMPERATURE CONTROL OF LASER SOURCES

(75) Inventor: Anthony S. Pruszenski, Georgetown, MA (US)

(73) Assignee: Textron Systems Corporation, Wilmington, MA (US)

( * ) Notice: Subject to any disclaimer, the term of this patent is extended or adjusted under 35 U.S.C. 154(b) by 868 days.

(21) Appl. No.: 12/111,281

(22) Filed: Apr. 29, 2008

(65) Prior Publication Data
US 2009/0269082 A1    Oct. 29, 2009

(51) Int. Cl.
H04B 10/142 (2006.01)
H04B 10/145 (2006.01)
H04B 10/148 (2006.01)
H04B 1/38 (2006.01)

(52) U.S. Cl. .................. 398/203; 398/204
(58) Field of Classification Search .......... 398/203–204
See application file for complete search history.

(56) References Cited

U.S. PATENT DOCUMENTS

| | | | |
|---|---|---|---|
| 5,247,310 A | 9/1993 | Waters | |
| 5,263,193 A | 11/1993 | Lammers et al. | |
| 5,379,309 A | 1/1995 | Logan, Jr. | |
| 6,348,683 B1 | 2/2002 | Verghese et al. | |
| 6,889,008 B2 | 5/2005 | Ogusu | |
| 6,917,635 B2* | 7/2005 | Pruszenski, Jr. | 372/32 |
| 7,092,645 B1* | 8/2006 | Sternowski | 398/204 |
| 7,224,905 B2 | 5/2007 | Ruggiero | |
| 2002/0018494 A1 | 2/2002 | Vieira et al. | |
| 2003/0224801 A1* | 12/2003 | Lovberg et al. | 455/454 |

FOREIGN PATENT DOCUMENTS

| | | |
|---|---|---|
| EP | 1087478 A | 3/2001 |
| GB | 2438215 A | 11/2007 |
| WO | 03/102518 A | 12/2003 |
| WO | 2006/123163 A | 11/2006 |

OTHER PUBLICATIONS

Kawayama et al., "A Tunable Sub-Terahertz Wave Generation and Detection System with a Photomixer and a High-Tc Josephson Junction," Superconductor Science and Technology, vol. 19, No. 5, May 1, 2006, pp. S403-S406.
International Search Report and Written Opinion from PCT/US2009-035067, mailed on Apr. 21, 2009.

* cited by examiner

*Primary Examiner* — Danny Leung
(74) *Attorney, Agent, or Firm* — BainwoodHuang

(57) ABSTRACT

A heterodyne receiver includes first and second laser sources such as laser diodes which generate optical receiver oscillator (RO) signals having respective RO frequencies. Temperature control circuitry controls a temperature difference between the operating temperatures of the sources such that the RO frequencies differ by a difference frequency corresponding to the temperature difference, the difference frequency being offset from a frequency of a modulated millimeter-wave signal by a predetermined intermediate frequency. An electro-optical nonlinear mixer such as a photodiode receives the optical RO signals and the modulated millimeter-wave signal and generates an electrical intermediate-frequency (IF) signal, which is provided to an electrical amplifier/detector to detect the output signal corresponding to the modulation of the modulated millimeter-wave signal. The receiver may be used as part of a heterodyne transceiver which includes a transmitter, and the transmitter may also employ an optical heterodyne structure for generating a millimeter-wave signal for transmission.

7 Claims, 3 Drawing Sheets

HETERODYNE RECEIVER USING DIFFERENTIAL TEMPERATURE CONTROL OF LASER SOURCES

BACKGROUND

The present invention relates to the field of receivers and transceivers for millimeter waves, such as used in millimeter-wave radar systems for example, U.S. Pat. No. 5,263,193 discloses a heterodyne signal processing system that enables an intermediate-frequency (IF) signal detector to detect the electrical characteristics of millimeter and sub-millimeter wavelength electrical signals which have frequencies outside the operating range of the detector. Heterodyning signals entails mixing two frequency signals together to produce a heterodyne frequency signal which can equal the sum or difference of the frequencies of the first two signals. The millimeter wavelength signal is split into a first and second source signal with a power divider unit. The first source signal is frequency shifted to produce a frequency-shifted source signal. The first source signal is then used by any utilizing device of interest to produce a processed signal. The second source signal serves as a local oscillator (LO) signal. Finally a heterodyne mixer mixes the processed, frequency-shifted source signal with the LO signal to output an IF which is detectable by an ordinary IF signal detector.

U.S. Pat. No. 6,917,635 shows a method and system for producing radiation of a desired frequency with temperature invariance. Two or more radiation sources (such as laser diodes) that produce an output are included. A temperature difference between the sources is sensed and a temperature difference signal is produced. A control unit controls a heat flux to one or more or between two or more of the sources based on the temperature difference signal. The control unit may provide the heat flux by self-heating by a supplied current or by heater/coolers. The outputs of the two or more radiation sources are mixed in or on a nonlinear medium. The mixing of the outputs produces beat frequencies and a desired beat frequency or frequencies (in the millimeter-wave frequency region for example) may be selected by a resonant structure. The beat frequencies are invariant with fluctuations in ambient temperature.

SUMMARY

A heterodyne receiver is disclosed that includes first and second laser sources which generate respective optical receiver oscillator (RO) signals having respective RO frequencies. Temperature control circuitry controls a temperature difference between respective operating temperatures of the laser sources such that the RO frequencies differ by a difference frequency corresponding to the temperature difference, the difference frequency being offset from a frequency of a modulated millimeter-wave signal by a predetermined intermediate frequency. An electro-optical nonlinear mixer receives the optical RO signals and the modulated millimeter-wave signal and generates an electrical intermediate-frequency (IF) signal having the predetermined intermediate frequency. An electrical detector receives the electrical IF signal and generates an electrical detector output signal corresponding to the modulation of the modulated millimeter-wave signal.

The receiver may be used as part of a heterodyne transceiver which includes a transmitter. The transmitter may have a similar optical heterodyne structure for generating a millimeter-wave signal for transmission. There may be sharing of some components between transmitter and receiver by dividing operation into separate transmit and receive intervals.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

Figure 1:
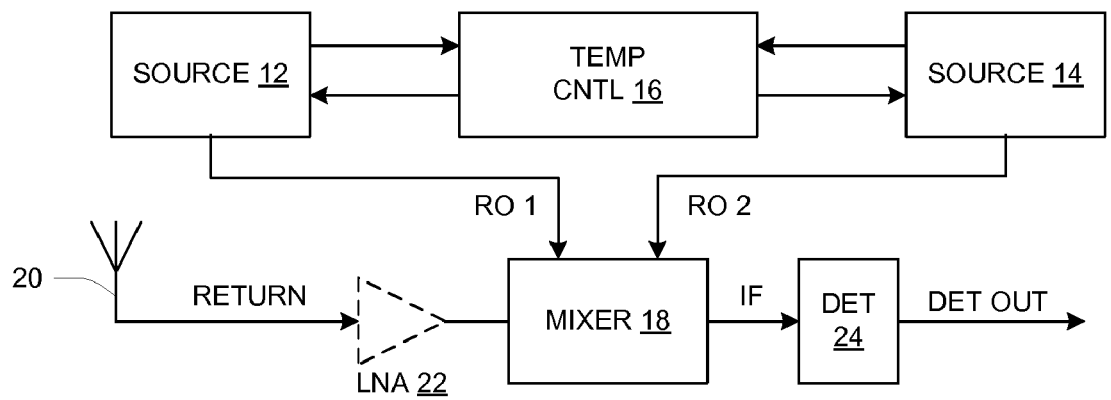
FIG. 1 is a block diagram of a heterodyne receiver.

FIG. 1 shows a heterodyne receiver 10 which employs a pair of laser sources 12, 14, temperature control circuitry (TEMP CNTL) 16, and an electro-optical non-linear mixer 18. The laser sources 12, 14 may be laser diodes or similar sources, and the mixer 18 may be a photosensitive diode or similar optical detector. A received millimeter-wave signal RETURN is received by an antenna 20 and supplied to the mixer 18, perhaps via an optional low-noise amplifier (LNA) 22. The mixer 18 generates an electrical intermediate-frequency (IF) output signal IF which is supplied to an electrical detector/amplifier circuit (DET) 24, which generates a detector output signal DET OUT.

The receiver 10 generally operates as follows. The respective frequencies of optical receiver-oscillator signals RO 1 and RO 2 from the sources 12, 14 are made to differ by a desired predetermined amount, such that when these two signals are combined with the millimeter-wave signal RETURN, a non-linear three-wave mixing action of the mixer 18 creates the electrical signal IF in a desired frequency range where it can be operated upon by the detector/amplifier circuit 24. The detector circuit 24 recovers the modulation appearing on the modulated millimeter-wave signal RETURN. Specific examples of the frequencies that may be utilized are provided below.

The difference between the frequencies of the signals RO 1 and RO 2 is obtained by action of the temperature control circuitry 16. As known in the art, sources such as laser diodes exhibit certain temperature dependence of the frequency of light that they emit. This temperature dependence can be on the order of 100 GHz per degree Celsius for a typical source operating in the 905 nm wavelength region. If the two sources 12 and 14 are sufficiently identical in structure, then the difference between their output frequencies can be controlled to a great degree by precisely controlling the temperature difference between them. The temperature control circuitry 16 operates to (1) sense a temperature difference between the two sources 12 and 14, and (2) apply differential heating to the two sources 12 and 14 to achieve a target temperature difference that corresponds to the desired frequency difference. FIG. 1 shows an open-loop configuration in which the temperature control circuitry 16 operates without any feedback regarding the actual frequencies of the RO 1, RO 2 or IF signals. Alternative embodiments may employ such frequency feedback in any of a variety of forms.

The following table illustrates an example of the frequencies that can be generated in an embodiment of the receiver 10:

| Signal | Frequency | Note |
|---|---|---|
| RO 1 | 331.27 THz ($\lambda$ = 905.0 nm) | |
| RO 2 | 331.38 THz ($\lambda$ = 905.3 nm) | differs from RO 1 by 110 GHz |
| RETURN | 109.65 GHz | Signal to be detected |
| IF | 350 MHz | = 110 GHz − 109.65 GHz |

Figure 2:
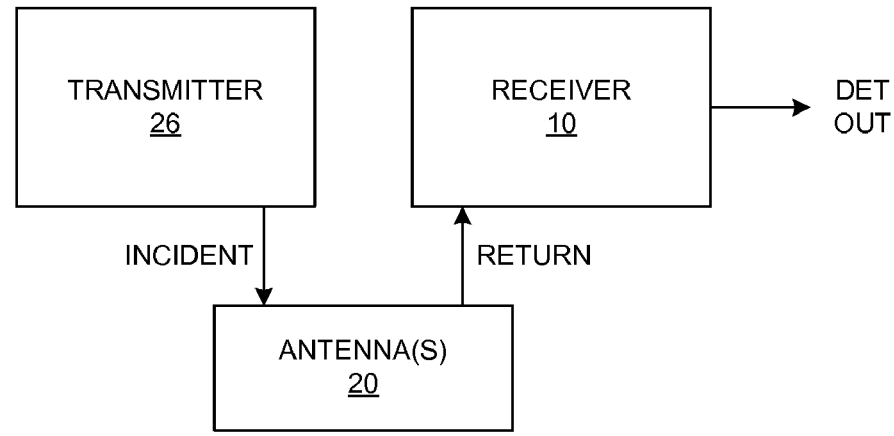
FIG. 2 is a block diagram of a heterodyne transceiver in generalized form.

FIG. 2 shows a transceiver utilizing the receiver 10 of FIG. 1. The transceiver includes a transmitter 26, the receiver 10, and antenna(s) 20. In one embodiment, the transceiver may be part of a millimeter-wave radar system, in which the transmitter 26 generates pulsed millimeter-wave energy INCIDENT which is directed towards a target by the antenna(s) 20, and reflected/returned millimeter-wave energy is gathered by the antenna(s) 20 and provided to the receiver 10 as the signal RETURN. The receiver 10 generates the signal DET OUT which may be operated upon by signal processing circuitry (not shown) to detect and identify interesting features of the target, as generally known in the art. It will be appreciated that in such a radar embodiment the signal RETURN is normally a reflected version of the signal INCIDENT and thus has the same nominal frequency. In alternative embodiments, for example communications systems, the transmitter 26 and receiver 10 may or may not operate at the same frequencies, and may or may not share the same antenna 20.

Techniques for generating millimeter-wave signals such as the transmitter output signal INCIDENT are generally known in the art. It is noted that the transmitter 26 may employ a heterodyne approach similar to that used in the receiver 10 as illustrated in FIG. 1, i.e., employing two or more optical sources whose outputs are mixed in a non-linear fashion to obtain the desired millimeter-wave output signal. One particular example of this technique is shown in U.S. Pat. No. 6,917,635 of Pruszenski et al. When the transmitter 26 employs such techniques, there is a possibility of selectively sharing components between the transmitter 26 and receiver 10 to achieve greater cost and/or space efficiency or other advantages. Examples of transceivers with such sharing are shown below. It will be appreciated, however, that in some embodiments any such sharing is either minimized or even non-existent. At one extreme, the transmitter 26 and its corresponding antenna are entirely physically distinct from the receiver 10 and its antenna.

Figure 3:
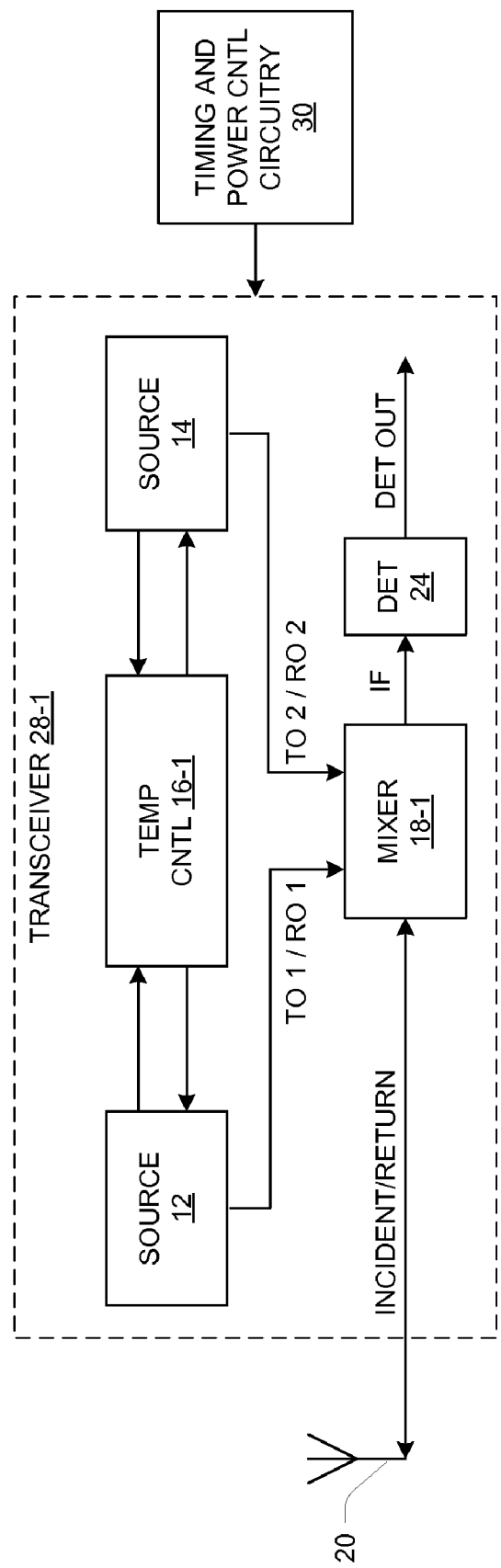
FIG. 3 is a block diagram of a heterodyne transceiver according to a first embodiment.

FIG. 3 shows one example of a transceiver 28-1 employing a high degree of sharing of components. In the illustrated transceiver 28-1, the sources 12, 14 as well as the temperature control circuitry 16, mixer 18-1 and antenna 20 are shared between transmitter and receiver. The components are utilized in a time-multiplexed fashion, such that operation alternates between transmitting and receiving, which can be characteristic of a radar system for example. The signals from the sources 12, 14 are shown as TO 1/RO 1 and TO 2/RO 2 respectively, indicating that during the transmit operation the transmit oscillator (TO) signals are present and during the receive operation the receive oscillator (RO) signals are present. During the transmit operation, the signal INCIDENT is generated by the mixer 18-1 and transmitted via the antenna 20, whereas during the receive operation the antenna 20 generates the received signal RETURN which is provided to the mixer 18-1 to generate the signal IF.

Time-multiplexed operation is controlled by timing and power control circuitry 30. Fundamentally, the circuitry 30 divides operation between transmit intervals and receive intervals, which may be accomplished in any of a variety of ways. For example, the circuitry 30 may employ timing circuitry that continuously alternates between two states at a desired rate, with one state being designated the transmit interval and the other state being designated the receive interval. Alternatively, one or both of the transmit interval and receive interval may be selected based on a separate control, including user-initiated control. It will be appreciated that in a radar application, the temporal spacing between the transmit and receive intervals will be related to the distance to the target.

During the receive interval, the temperature control circuitry 16 is controlled by the timing and power control circuitry 30 to maintain a desired first temperature difference between the sources 12 and 14 so that the mixing action of the mixer 18-1 results in the IF signal having the desired frequency, such as in the above example. Also, the sources 12, 14 are driven at power levels which can be significantly lower than during the transmit interval. The drive current provided to the sources 12, 14 may be only high enough to accomplish lasing and to generate sufficient power in the signals RO 1 and RO 2 that the signal IF can be detected by the detector 24. For example, the current and power levels for receive operation may be in the ranges of 5 to 10 milliamps and 3 to 50 milliwatts respectively.

During the transmit interval, the temperature control circuitry 16 is controlled by the timing and power control circuitry 30 to maintain a desired second temperature difference between the sources 12 and 14 so that the mixing action of the mixer 18-1 results in the transmit signal INCIDENT having the desired frequency. It will be appreciated that this second temperature difference may differ from the first temperature difference by an amount corresponding to the frequency of the IF signal. Additionally, the sources 12 and 14 are driven at power levels which may be considerably higher than during the receive interval, to provide the desired higher power level of the transmit signal INCIDENT. An example of the current and power levels for transmit operation is 5 to 50 amps and 10 to 50 watts.

Figure 4:
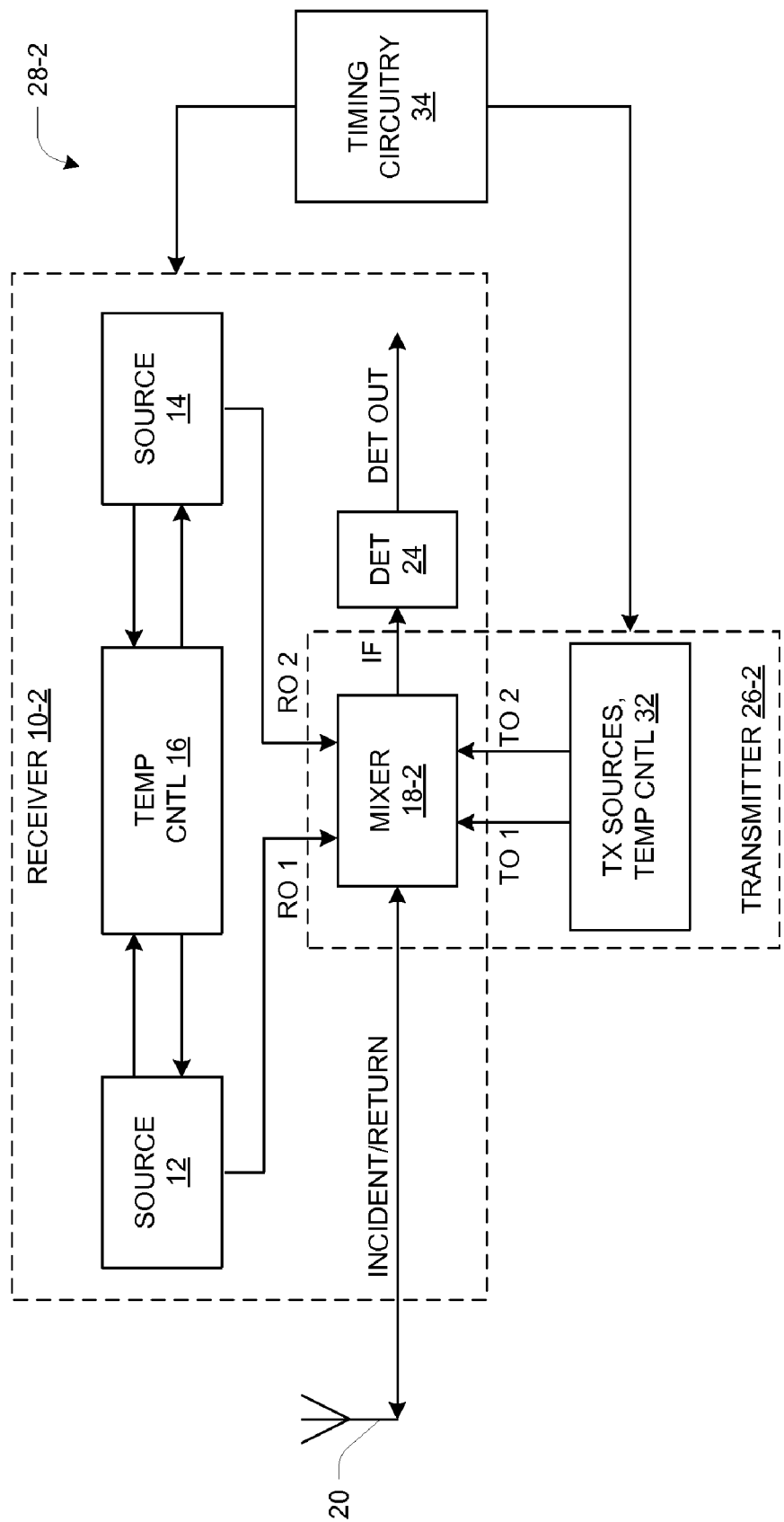
FIG. 4 is a block diagram of a heterodyne transceiver according to a second embodiment.

FIG. 4 shows an example of a transceiver 28-2 employing somewhat less sharing of components—the main components shared between the receiver 10-2 and the transmitter 26-2 are the mixer 18-2 and antenna 20. The transmitter 26-2 includes its own sources and temperature control circuitry 32 (details omitted) and generates the transmit oscillator signals TO 1 and TO 2 independently of the receiver 10-2. Timing circuitry 34 is utilized to define the distinct transmit and receive intervals to enable the shared operation of the mixer 18-2 and antenna 20.

While various embodiments of the invention have been particularly shown and described, it will be understood by those skilled in the art that various changes in form and details may be made therein without departing from the spirit and scope of the invention as defined by the appended claims.

What is claimed is:

1. A heterodyne transceiver, comprising:
    (1) a heterodyne receiver having:
        first and second laser sources operative to generate respective optical receiver oscillator (RO) signals having respective RO frequencies;
        temperature control circuitry operative to control a temperature difference between respective operating temperatures of the first and second laser sources such that the RO frequencies differ by a difference frequency corresponding to the temperature difference, the difference frequency being offset from a frequency of a modulated millimeter-wave signal by a predetermined intermediate frequency, the millimeter-wave signal being a return signal from a target, the return signal resulting from interaction of an incident millimeter-wave signal with the target;

an electro-optical nonlinear mixer operative to receive the optical RO signals and the modulated millimeter-wave signal and generate an electrical intermediate-frequency (IF) signal having the predetermined intermediate frequency; and an electrical amplifier/detector operative to receive the electrical IF signal and generate an electrical detector output signal corresponding to the modulation of the modulated millimeter-wave signal; and (2) a heterodyne transmitter operative to generate the incident millimeter-wave signal, wherein the electrical IF signal is generated during a receive interval separate from a transmit interval during which the incident millimeter-wave signal is generated, and wherein the electro-optical nonlinear mixer is operative during the transmit interval to receive optical transmit oscillator (TO) signals to generate the incident millimeter-wave signal, the optical TO signals having respective TO frequencies differing by the frequency of the incident millimeter-wave signal.

2. The heterodyne transceiver of claim 1, wherein:

the first and second laser sources are operative during the receive interval to generate the optical RO signals, the temperature difference is a first temperature difference, and the temperature control circuitry is operative during the receive interval to control the first temperature difference; and the heterodyne transmitter includes the first and second laser sources, further operative during the transmit interval to generate the optical TO signals; and the temperature control circuitry is operative during the transmit interval to control a second temperature difference between respective operating temperatures of the first and second laser sources, the second temperature difference corresponding to the frequency of the incident millimeter-wave signal.

3. The heterodyne transceiver of claim 1, wherein:

the temperature difference is a first temperature difference, and the temperature control circuitry is first temperature control circuitry operative to control the first temperature difference; and the heterodyne transmitter includes (1) third and fourth laser sources operative to generate the TO signals, and (2) second temperature control circuitry operative to control a second temperature difference between respective operating temperatures of the third and fourth laser sources, the second temperature difference corresponding to the frequency of the modulated millimeter-wave signal.

4. The heterodyne receiver of claim 1, further comprising a low-noise amplifier coupled between the non-linear mixer and a receive antenna, the low-noise amplifier being operative to amplify a received signal from the receive antenna to generate the modulated millimeter-wave signal.

5. A heterodyne transceiver as in claim 2, wherein:

during the receive interval, the first and second laser sources are driven at respective power levels in a range of 3 to 50 milliwatts; and during the transmit interval, the first and second laser sources are driven at respective optical power levels in a range of 10 to 50 watts.

6. A heterodyne transceiver as in claim 3, wherein:

during the receive interval, the first and second laser sources are driven at respective power levels in a range of 3 to 50 milliwatts; and during the transmit interval, the third and fourth laser sources are driven at respective optical power levels in a range of 10 to 50 watts.

7. A heterodyne transceiver as in claim 1, wherein:

the temperature control circuitry is operative when controlling the temperature difference to (a) sense a sensed temperature difference between respective operating temperatures of the first and second laser sources, and (b) apply differential heating to the first and second laser sources based on the sensed temperature difference to achieve a desired temperature difference between the first and second laser sources and thereby cause the RO frequencies to differ by a difference frequency, the difference frequency being offset from a frequency of a modulated millimeter-wave signal by a predetermined intermediate frequency; and the electro-optical nonlinear mixer is operative to combine the optical RO signals with the modulated millimeter-wave signal by non-linear three-wave mixing action to generate the electrical IF signal.

\* \* \* \* \*